US011079878B1

(12) United States Patent
Krah

(10) Patent No.: US 11,079,878 B1
(45) Date of Patent: Aug. 3, 2021

(54) NOISE MITIGATION TOUCH SENSING CIRCUIT

(71) Applicant: Apple Inc., Cupertino, CA (US)

(72) Inventor: Christoph H. Krah, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/926,421

(22) Filed: Jul. 10, 2020

Related U.S. Application Data

(60) Provisional application No. 63/002,593, filed on Mar. 31, 2020.

(51) Int. Cl.
| G06F 3/041 | (2006.01) |
| G06F 3/044 | (2006.01) |
| H03F 3/45 | (2006.01) |
| H03H 7/06 | (2006.01) |

(52) U.S. Cl.
CPC ......... G06F 3/04182 (2019.05); G06F 3/044 (2013.01); H03F 3/45475 (2013.01); H03H 7/06 (2013.01); *H03F 2200/129* (2013.01); *H03F 2200/165* (2013.01); *H03F 2203/45512* (2013.01); *H03F 2203/45526* (2013.01); *H03F 2203/45528* (2013.01)

(58) Field of Classification Search
CPC ....... G06F 3/04182; G06F 3/044–0448; H03F 2200/129; H03F 2200/165
See application file for complete search history.

(56) References Cited

U.S. PATENT DOCUMENTS

| 7,986,193 | B2 | 7/2011 | Krah | |
| 9,823,790 | B2 | 11/2017 | Lee et al. | |
| 10,254,894 | B2 | 4/2019 | Nathan et al. | |
| 2014/0071092 | A1* | 3/2014 | Shih | G06F 3/0446 345/175 |
| 2014/0240278 | A1* | 8/2014 | Kim | H03F 1/14 345/174 |
| 2016/0132147 | A1 | 5/2016 | Lim | |

\* cited by examiner

*Primary Examiner* — Laurence J Lee
(74) *Attorney, Agent, or Firm* — Kubota & Basol LLP

(57) ABSTRACT

Techniques for mitigating noise in a touch signal are disclosed. To reduce or eliminate noise in a touch signal, the touch activity can be filtered out of a touch signal, thus isolating the noise. In some examples, the noise is then provided to the non-inverting input port of a differential amplifier while the unfiltered touch signal is provided to the inverting input port of the differential amplifier. The noise, which is now common on both inputs, is automatically eliminated or reduced by the differential amplifier.

20 Claims, 6 Drawing Sheets

NOISE MITIGATION TOUCH SENSING CIRCUIT

CROSS REFERENCE TO RELATED APPLICATIONS

This application claims the benefit under 35 USC 119(e) of U.S. Provisional Application No. 63/002,593, filed Mar. 31, 2020, the contents of which are incorporated herein by reference in their entirety for all purposes.

FIELD OF THE DISCLOSURE

This relates generally to touch sensor panels, and more particularly to techniques for mitigating noise on touch signals.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are popular because of their ease and versatility of operation as well as their declining price. Touch screens can include a touch sensor panel, which can be a clear panel with a touch-sensitive surface, and a display device such as a liquid crystal display (LCD), light emitting diode (LED) display or organic light emitting diode (OLED) display that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface.

Touch sensor panels can include an array of touch sensors capable of detecting touches (the touching by an object such as a finger or stylus upon a touch-sensitive surface). Some touch sensor panels are able to detect multiple touches (e.g., the touching of multiple fingers upon a touch-sensitive surface at distinct locations at or about the same time) and near touches (e.g., fingers within the near-field detection capabilities of their touch sensors), and identify and track their locations.

In reality, however, signals detected on a touch sensor panel include noise generated by environmental factors, other electronic circuits, and/or inherent noise sources. For example, an integrated display circuit can generate noise that is received by the touch sensing circuits. Noise on a touch signal can cause false positives, false negatives, or otherwise negatively affect the accuracy of a touch sensor panel, negatively affecting user experience.

BRIEF SUMMARY OF THE DISCLOSURE

This relates generally to improving touch detection in touch sensor panels, and more particularly to techniques for reducing and/or eliminating noise on a touch signal. In some examples, noise can be introduced into a touch signal via other electronic circuits. For example, a sense channel can receive drive and/or sense signal from other sense channels. In other examples, a sense channel can receive display signals generated by an integrated display circuit. In some examples, a sense channel can receive noise from the environment. In some examples, a baseline touch signal when no touch is received (e.g., a baseline capacitance) can be interpreted as noise.

Noise in the context of touch signals can cause detection of a touch from the signal when none occurred (e.g., false positive), detection of no touch when a touch did occur (e.g., false negative), or a reduction in the accuracy of touch recognition. To minimize or eliminate the effect of noise, many techniques can be used. In some examples, a differential amplifier is configured to receive and amplify the touch signal received from the touch electrodes. In some examples, the differential amplifier can be leveraged to mitigate noise in the touch signal. Thus, examples of this disclosure describe ways in which noise in the touch signal can be isolated and introduced to both the inverting and noninverting input ports of the differential amplifier, thus causing some or all of the noise signal to be eliminated by the differential amplifier.

DETAILED DESCRIPTION OF THE DISCLOSURE

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

This relates generally to improving touch detection in touch sensor panels, and more particularly to techniques for reducing and/or eliminating noise on a touch signal. In some examples, noise can be introduced into a touch signal via other electronic circuits. For example, a sense channel can receive drive and/or sense signal from other sense channels. In other examples, a sense channel can receive display signals generated by an integrated display circuit. In some examples, a sense channel can receive noise from the environment. In some examples, a baseline touch signal when no touch is received (e.g., a baseline capacitance) can be interpreted as noise.

Noise in the context of touch signals can cause detection of a touch from the signal when none occurred (e.g., false positive), detection of no touch when a touch did occur (e.g., false negative), or reduce the accuracy of touch recognition. To minimize or eliminate the effect of noise, many techniques can be used. In some examples, a differential amplifier is configured to receive and amplify the touch signal received from the touch electrodes. In some examples, the differential amplifier can be leveraged to mitigate noise in the touch signal. Thus, examples of this disclosure describe ways in which noise in the touch signal can be isolated and introduced to both the inverting and noninverting input ports of the differential amplifier, thus causing some or all of the noise signal to be eliminated by the differential amplifier.

Figure 1A:
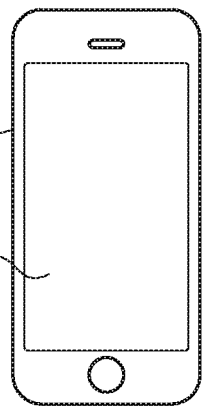
FIGS. 1A-1E illustrate touch sensing devices or systems that can include a touch screen or touch sensor panel according to examples of the disclosure.
Figure 1B:
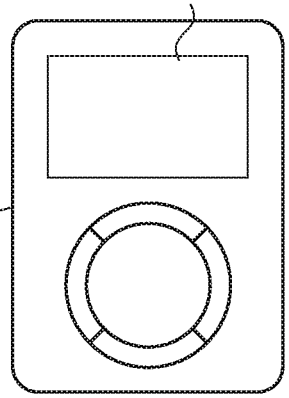
Figure 1C:
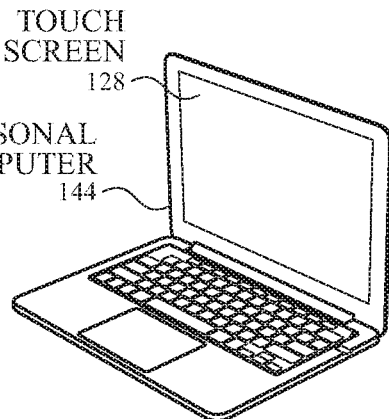
Figure 1D:
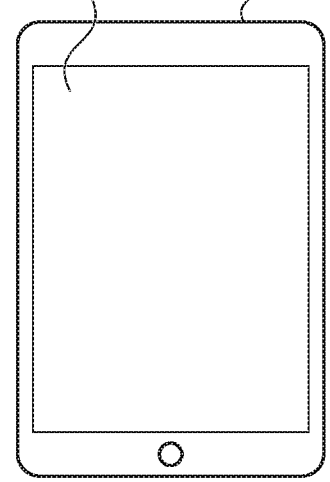
Figure 1E:
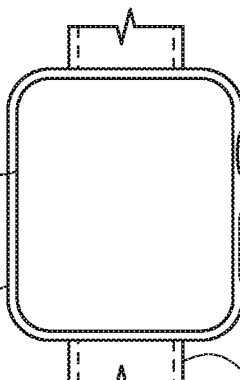

FIGS. 1A-1E illustrate touch sensing devices or systems that can include a touch screen or touch sensor panel according to examples of the disclosure. FIG. 1A illustrates an example mobile telephone 136 that can include a touch screen 124 according to examples of the disclosure. FIG. 1B illustrates an example digital media player 140 that can include a touch screen 126 and/or a touch sensor panel according to examples of the disclosure. FIG. 1C illustrates an example personal computer 144 that can include a touch screen 128 and a track pad with a touch sensor panel according to examples of the disclosure. FIG. 1D illustrates an example tablet computing device 148 that can include a touch screen 130 according to examples of the disclosure. FIG. 1E illustrates an example wearable device 150 that includes a touch screen 132 and can be attached to a user using a strap 152 according to examples of the disclosure. It is understood that a touch screen (which can include a touch sensor panel) or a touch sensor panel (without a touch screen, such as in a trackpad) can be implemented in other devices as well, and that the example systems of FIGS. 1A-1E can further include touch sensor panels on surfaces not shown in the figures.

In some examples, touch screens 124, 126, 128, 130 and 132 and touch sensor panels can be based on self-capacitance. A self-capacitance based touch system can include a matrix of small, individual plates of conductive material or groups of individual plates of conductive material forming larger conductive regions that can be referred to as touch electrodes or as touch node electrodes. For example, a touch screen or touch sensor panel can include a plurality of individual touch electrodes, each touch electrode identifying or representing a unique location (e.g., a touch node) on the touch screen or touch sensor panel at which touch or proximity is to be sensed, and each touch node electrode being electrically isolated from the other touch node electrodes in the touch screen/panel. Such a touch screen/panel can be referred to as a pixelated self-capacitance touch screen/panel, though it is understood that in some examples, the touch node electrodes on the touch screen/panel can be used to perform scans other than self-capacitance scans on the touch screen/panel (e.g., mutual capacitance scans). During operation, a touch node electrode can be stimulated with an alternating current (AC) waveform, and the self-capacitance to ground of the touch node electrode can be measured. As an object approaches the touch node electrode, the self-capacitance to ground of the touch node electrode can change (e.g., increase). This change in the self-capacitance of the touch node electrode can be detected and measured by the touch sensing system to determine the positions of multiple objects when they touch, or come in proximity to, the touch screen/panel. In some examples, the touch node electrodes of a self-capacitance based touch system can be formed from rows and columns of conductive material, and changes in the self-capacitance to ground of the rows and columns can be detected, similar to above. In some examples, a touch screen/panel can be multi-touch, single touch, projection scan, full-imaging multi-touch, capacitive touch, etc.

In some examples, touch screens 124, 126, 128, 130 and 132 and touch sensor panels can be based on mutual capacitance. A mutual capacitance based touch system can include electrodes arranged as drive and sense lines that may cross over each other on different layers (in a double-sided configuration), or may be adjacent to each other on the same layer (e.g., as described below with reference to FIG. 3). The crossing or adjacent locations can form touch nodes. During operation, the drive line can be stimulated with an AC waveform and the mutual capacitance of the touch node can be measured. As an object approaches the touch node, the mutual capacitance of the touch node can change (e.g., decrease). This change in the mutual capacitance of the touch node can be detected and measured by the touch sensing system to determine the positions of multiple objects when they touch, or come in proximity to, the touch screen/panel. As described herein, in some examples, a mutual capacitance based touch system can form touch nodes from a matrix of small, individual plates of conductive material.

In some examples, touch screens 124, 126, 128, 130 and 132 or touch sensor panels can be based on mutual capacitance and/or self-capacitance. The electrodes can be arranged as a matrix of small, individual plates of conductive material or as drive lines and sense lines, or in another pattern. The electrodes can be configurable for mutual capacitance or self-capacitance sensing or a combination of mutual and self-capacitance sensing. For example, in one mode of operation electrodes can be configured to sense mutual capacitance between electrodes and in a different mode of operation electrodes can be configured to sense self-capacitance of electrodes. In some examples, some of the electrodes can be configured to sense mutual capacitance therebetween and some of the electrodes can be configured to sense self-capacitance thereof.

Figure 2:
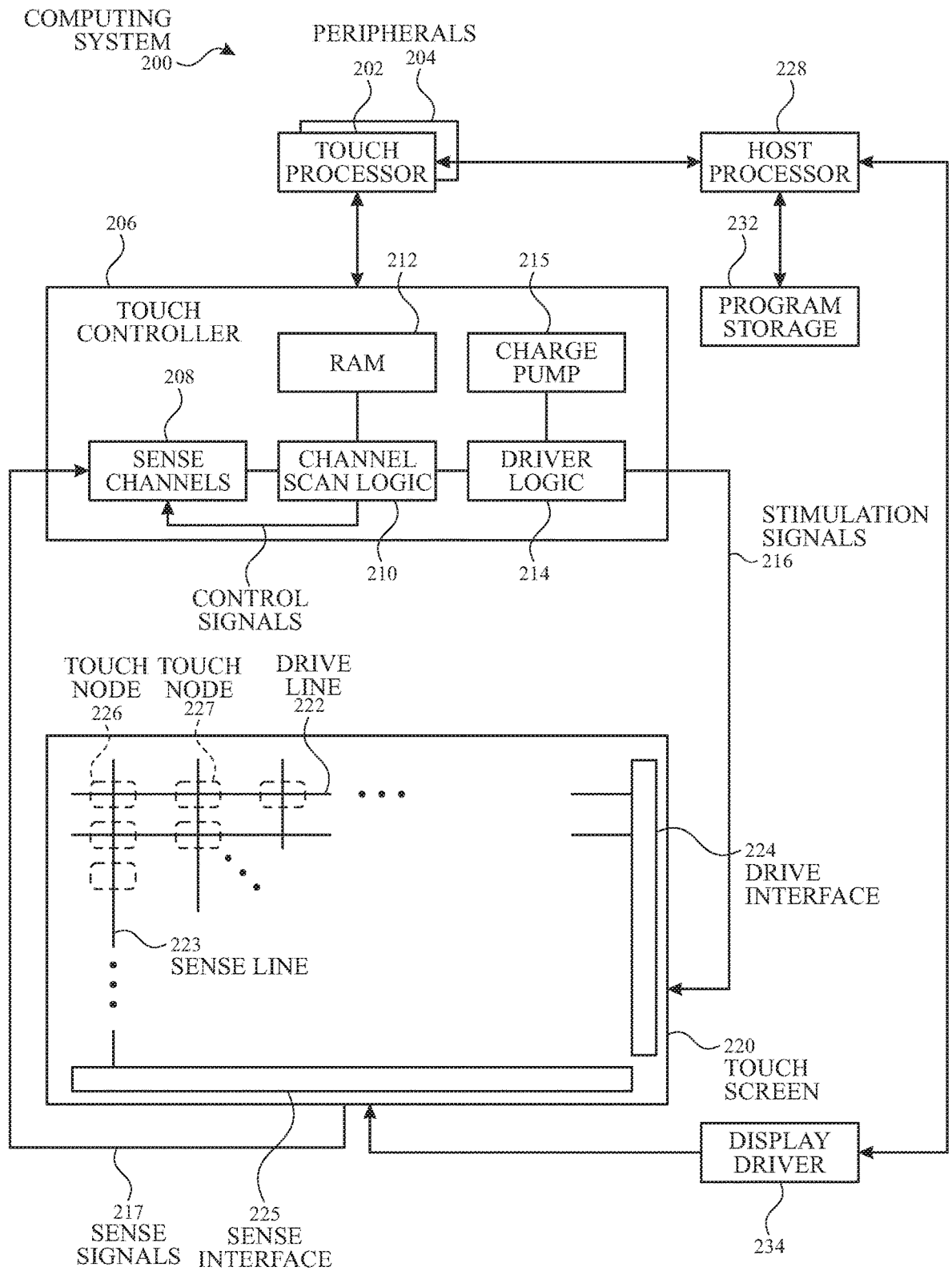
FIG. 2 illustrates a computing system including a touch screen according to examples of the disclosure.

FIG. 2 illustrates an example computing system including a touch screen according to examples of the disclosure, although it should be understood that the illustrated touch screen 220 (which includes a touch sensor panel) could instead be only a touch sensor panel. Computing system 200 can be included in, for example, a mobile phone, tablet, touchpad, portable or desktop computer, portable media player, wearable device or any mobile or non-mobile computing device that includes a touch screen or touch sensor panel. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers and the like. Touch controller 206 can include, but is not limited to, one or more sense channels 208, channel scan logic 210 and driver logic 214. Channel scan logic 210 can access RAM 212, autonomously read data from the sense channels and provide control for the sense channels. In addition, channel scan logic 210 can control driver logic 214 to generate stimulation signals 216 at various frequencies and/or phases that can be selectively applied to drive regions of the touch sensing circuitry of touch screen 220, as described in more detail below. In some examples, touch controller 206, touch processor 202 and peripherals 204 can be integrated into a single application specific integrated circuit (ASIC), and in some examples can be integrated with touch screen 220 itself. The example computing system 200 of FIG. 2 can be configured to implement and perform any of the scans and comparisons described below.

It should be apparent that the architecture shown in FIG. 2 is only one example architecture of computing system 200, and that the system could have more or fewer components than shown, or a different configuration of components. The various components shown in FIG. 2 can be implemented in hardware, software, firmware or any combination thereof, including one or more signal processing and/or application specific integrated circuits.

Computing system 200 can include a host processor 228 for receiving outputs from touch processor 202 and performing actions based on the outputs. For example, host processor 228 can be connected to program storage 232 and a display controller/driver 234 (e.g., a Liquid-Crystal Display (LCD) driver). It is understood that although some examples of the disclosure may described with reference to LCD displays, the scope of the disclosure is not so limited and can extend to other types of displays, such as Light-Emitting Diode (LED) displays, including Organic LED (OLED), Active-Matrix Organic LED (AMOLED) and Passive-Matrix Organic LED (PMOLED) displays. Display driver 234 can provide voltages on select (e.g., gate) lines to each pixel transistor and can provide data signals along data lines to these same transistors to control the pixel display image.

Host processor 228 can use display driver 234 to generate a display image on touch screen 220, such as a display image of a user interface (UI), and can use touch processor 202 and touch controller 206 to detect a touch on or near touch screen 220, such as a touch input to the displayed UI. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Note that one or more of the functions described in this disclosure can be performed by firmware stored in memory (e.g., one of the peripherals 204 in FIG. 2) and executed by touch processor 202, or stored in program storage 232 and executed by host processor 228. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. In some examples, RAM 212 or program storage 232 (or both) can be a non-transitory computer readable storage medium. One or both of RAM 212 and program storage 232 can have stored therein instructions, which when executed by touch processor 202 or host processor 228 or both, can cause the device including computing system 200 to perform one or more functions and methods of one or more examples of this disclosure. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Touch screen 220 can be used to derive touch information at multiple discrete locations of the touch screen, referred to herein as touch nodes. Touch screen 220 can include touch sensing circuitry that can include a capacitive sensing medium having a plurality of drive lines 222 and a plurality of sense lines 223. It should be noted that the term "lines" is sometimes used herein to mean simply conductive pathways, as one skilled in the art will readily understand, and is not limited to elements that are strictly linear, but includes pathways that change direction, and includes pathways of different size, shape, materials, etc. Drive lines 222 can be driven by stimulation signals 216 from driver logic 214 through a drive interface 224, and resulting sense signals 217 generated in sense lines 223 can be transmitted through a sense interface 225 to sense channels 208 in touch controller 206. In this way, drive lines and sense lines can be part of the touch sensing circuitry that can interact to form capacitive sensing nodes, which can be thought of as touch picture elements (touch pixels) and referred to herein as touch nodes, such as touch nodes 226 and 227. This way of understanding can be particularly useful when touch screen 220 is viewed as capturing an "image" of touch ("touch image"). In other words, after touch controller 206 has determined whether a touch has been detected at each touch nodes in the touch screen, the pattern of touch nodes in the touch screen at which a touch occurred can be thought of as an "image" of touch (e.g., a pattern of fingers touching the touch screen). As used herein, an electrical component "coupled to" or "connected to" another electrical component encompasses a direct or indirect connection providing electrical path for communication or operation between the coupled components. Thus, for example, drive lines 222 may be directly connected to driver logic 214 or indirectly connected to driver logic 214 via drive interface 224 and sense lines 223 may be directly connected to sense channels 208 or indirectly connected to sense channels 208 via sense interface 225. In either case an electrical path for driving and/or sensing the touch nodes can be provided.

Figure 3:
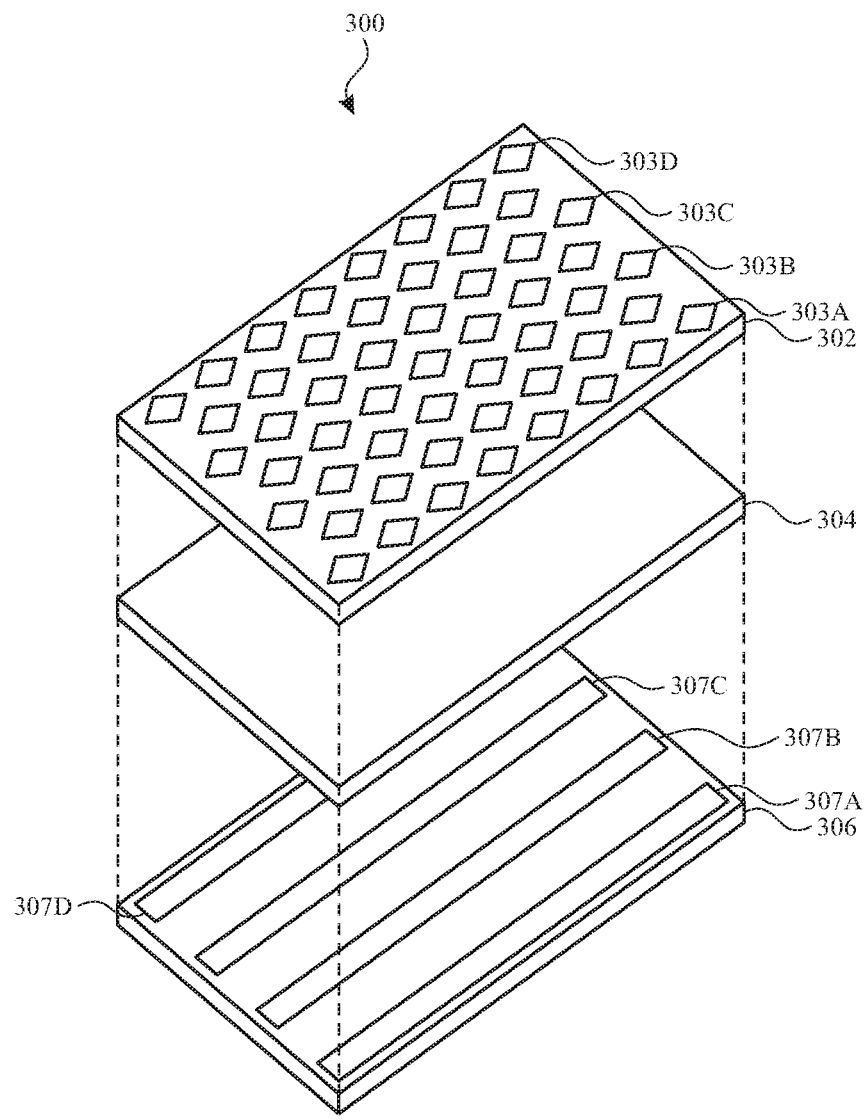
FIG. 3 illustrates an example stackup of a touch screen according to examples of this disclosure.

FIG. 3 illustrates an example stackup of a touch screen 300 according to examples of this disclosure. In some embodiments, touch screen 300 is an integrated touch screen device in which display components are integrated with touch sensing components (e.g., an "on-cell" touch panel), as will be described in more detail below. In some example, touch screen 300 can have one or more touch circuitry layers, including touch sensor panel layer 302, and one or more display circuitry layers (e.g., of an LED or OLED display) including a cathode layer 304 and display data layer 306. In some examples, touch sensor panel layer 302 can include touch sensor panel(s) in accordance with examples of this disclosure (e.g., touch sensor panel layer 302 is the same as or shares similar characteristics as touch screen 220). In some examples, touch sensor panel layer 302 includes columns of touch electrodes and rows of touch electrodes (e.g., formed by diamond-shaped electrodes 303A-D, connections not shown), such as touch nodes 226 and 227 described above with respect to FIG. 2. In some examples, display data layer 306 can include a plurality of display data lines 307A-D. In some examples, the display data lines provide data and/or drive elements of the LED or OLED display (e.g., to display an image). In some examples, the display data lines 307A-D can be routed in parallel to the columns of touch electrodes and perpendicular to the row of touch electrodes. It is understood that although FIG. 3 illustrates one display data line disposed under each of the column of touch electrodes, multiple display data lines can be disposed beneath the columns of split sense electrodes (e.g., one or more display data line under each column or one or more display data lines under one or more of the columns). In some example, when display data lines 307A-D are driven (e.g., with a stimulation voltage or current), noise can be capacitively coupled onto touch electrodes 303A-D through cathode layer 304 (e.g., the stimulation signal can couple from the display data lines 307A-D to the cathode layer 304 and from cathode layer 304 to touch electrodes 303A-D). As the distance between display data lines 307A-D and touch electrodes 303A-D decreases, the amount of noise coupling between the display layers and the touch layers can increase. Thus, the system and methods described herein (e.g., with respect to FIGS. 4-6) mitigate the effect of the noise coupled from display signal lines to the touch electrodes. It is understood that stackup 300 is merely exemplary and any integrated or non-integrated touch panel or touch screen can benefit from the noise mitigation techniques described herein.

Figure 4A:
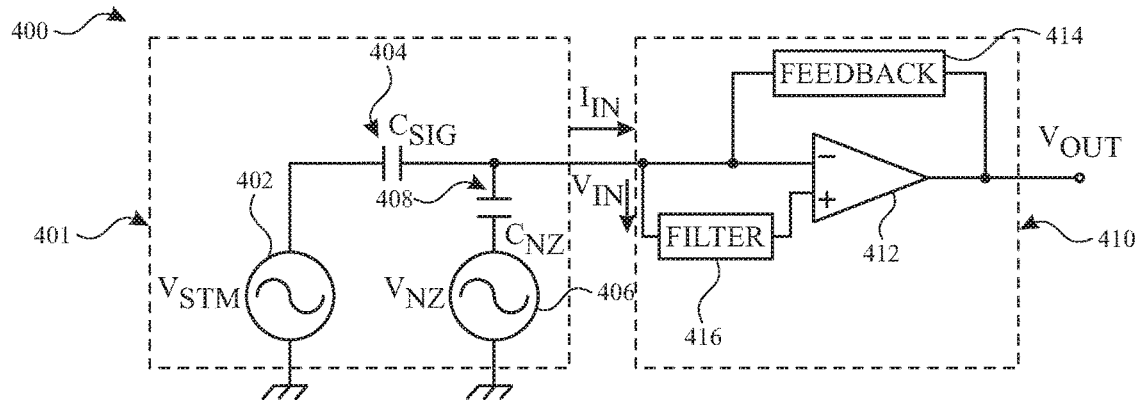
FIGS. 4A-4C illustrate exemplary touch sensor circuits for filtering noise from a touch signal according to examples of the disclosure.
Figure 4B:
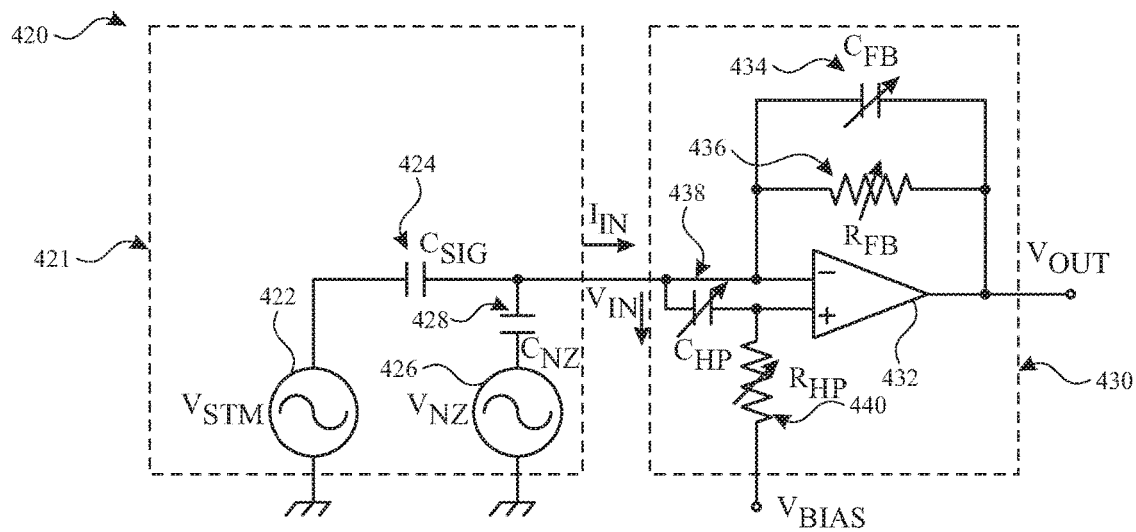
Figure 4C:
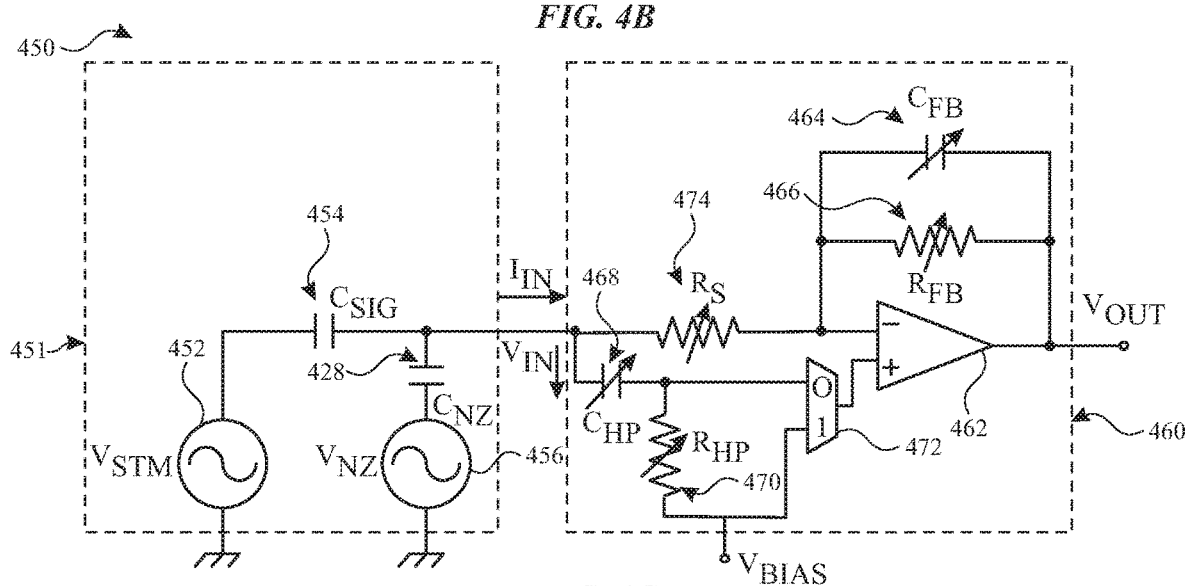

FIGS. 4A-4C illustrate exemplary touch sensor circuits for filtering noise from a touch signal according to examples of the disclosure. FIG. 4A illustrates an exemplary touch sensor circuit 400. In some embodiments, the touch sensor circuit 400 is an embodiment of a frequency selective amplifier (e.g., an amplification circuit that is able to selectively amplify certain frequencies while not amplifying or filtering other frequencies). In some examples, touch sensor circuit 400 receives a touch sense signal from one or more touch electrodes, amplifies and/or buffers the touch signal, and transmits the touch signal for further processing, such as by touch processor 202. In some examples, touch sensor circuit 400 is integrated with sense channel 208 and can be coupled to a single sense signal or a plurality of sense signals. In some examples, touch sensor circuit 400 includes touch panel 401 and sensing circuit 410.

As shown in FIG. 4A, touch panel 401 is a circuit model of a touch sensor panel (e.g., touch screen 220 and/or touch sensor panel layer 302). It is understood that the components in touch panel 401 are a simplified representation of a touch panel. In some examples, touch panel 401 includes a stimulation source 402 that generates stimulation signal $V_{STM}$. In some examples, stimulation source 402 provides a stimulation signal (e.g., drive signal) to one or more touch electrodes on a touch panel. In some examples, the one or more touch electrodes on the touch panel receive the stimulation signal from stimulation source 402. As shown in FIG. 4A, the one or more touch electrodes can be modeled as capacitor 404 having a capacitance $C_{SIG}$ (e.g., the capacitance between a drive electrode and a sense electrode in a mutual capacitance sensing scheme).

In FIG. 4A, the noise experienced by the one or more touch electrodes (e.g., from the integrated display or other components of the device) is modeled as noise source 406, which generates noise signal $V_{NZ}$ that is coupled sensing circuit 410 through noise capacitor 408 having a capacitance $C_{NZ}$.

In some examples, touch panel 401 generates a touch sense current, $I_{in}$. In some examples, $I_{in}$ includes a touch component ($I_{sig}$) and a noise component ($I_N$). In some examples, the noise component can perturb and change the total current generated by touch panel 401 and affect the perceivable (e.g., detectable) current that is generated as a result of touch activity. In some examples, $I_{sig}$ is a touch measurement signal current generated by a self-capacitance or a mutual-capacitance scan of one or more touch electrodes on a touch sensitive surface (e.g., the signal output of $C_{SIG}$ after being stimulated by $V_{STM}$), such as touch screen 220 and/or touch sensor panel layer 302 (e.g., the signal at one of the sense line(s) 223 and/or one of the sense signal(s) 217). For example, on a touch panel that is configured in a mutual capacitance mode, when no touch activity is detected on the touch panel (e.g., touch screen 220), then in the absence of noise, $I_{IN}$ is equal to $I_{sig}$. In such examples, $I_{sig}$ is proportional to the capacitance $C_{SIG}$ of capacitor 404. When touch activity is detected on the touch panel (e.g., at the respective portion of the touch panel corresponding to the touch electrode(s) that are coupled to touch sensor circuit 400), then $C_{SIG}$ changes (e.g., increases or decreases) according to the capacitive effect of the touch activity (e.g., $C_{SNS}$, the change in capacitance due to touch activity) and Ism is similarly changed (e.g., increased or decreased) to include the touch signal indicative of the detected touch activity (e.g., Isms, the change in the current through $C_{SIG}$ due to the touch activity). In some examples, IN represents noise generated from the environment, noise generated by other components of the electronic device (e.g., the display, communication circuitry, other electronic components, other touch electrodes, etc.), baseline capacitance (e.g., inherent in the touch electrodes), and/or any other noise received by touch sensor circuit 400 that is not associated with an actual touch. For example, in FIG. 4A, IN is the noise current coupled onto the touch sensor circuit by $V_{NZ}$ (e.g., the current passing through $C_{NZ}$).

In some examples, sensing circuit 410 is coupled to and receives $I_{IN}$ from touch panel 401. In some examples, sensing circuit 410 includes an amplifier 412, a feedback block 414, and a filter block 416. As shown in FIG. 4A, amplifier 412 is an operational amplifier and/or a differential amplifier including an inverting input port, a noninverting input port, and an output port. Amplifier 412 amplifies the difference between the signal on the inverting input port and the signal on the noninverting input port and outputs the amplified difference to the output port. For example, if the noninverting input port of amplifier 412 is coupled to a reference voltage, such as system ground, then amplifier 412 amplifies the signal on the inverting input port with respect to ground. As shown in FIG. 4A, touch panel 401 is coupled to the inverting input port of amplifier 412. Thus, the inverting input port of amplifier 412 receives $I_{in}$, which includes a touch signal current component ($I_{sig}$) and a noise current component (IN). As shown in FIG. 4A, $V_{IN}$ represents the voltage at the input of sensing circuit 410 (e.g., at the inverting input port of amplifier 412). In some examples, $V_{IN}$ has a DC and AC component. In some examples, the AC component of $V_{IN}$ is a divided voltage of $V_{OUT}$ (e.g., a voltage divided formed by feedback block 414 and/or the input resistance of amplifier 412). Thus, the output, $V_{OUT}$, of amplifier 412 is based on the input voltage and feedback block 414. In some examples, the DC component of $V_{IN}$ is the common mode voltage of amplifier 412.

In some examples, sensing circuit 410 includes feedback block 414 coupled between the output port of amplifier 412 and the inverting input port of amplifier 412. In some examples, feedback block 414 includes capacitor(s) and/or resistor(s) and controls the amplification characteristics of amplifier 412. In some examples, feedback block 414 is variable and can be controlled via a control signal (e.g., from the touch processor) to modify the amplification characteristics of amplifier 412. In some examples, amplifier 412 and feedback block 414 can be arranged to form a charge amplifier. In some examples, amplifier 412 and feedback block 414 can be arranged to form a transimpedance (TIA) amplifier.

In some examples, sensing circuit 410 includes filter block 416 coupled between signal source 402 and the non-inverting input port of amplifier 412. In some examples, filter block 416 receives $V_{in}$ from the signal source 402, filters $V_{sig}$ (e.g., the touch signal in $V_{in}$) based on the characteristics of filter block 416 (e.g., attenuates or removes $V_{sig}$ from yin based on the transfer function of the filter) and provides a filtered signal to the non-inverting input port of amplifier 412. Thus, sensing circuit 410 amplifies the difference between Vin (e.g., including $V_{sig}$ and $V_N$) and the filtered signal (e.g., including $V_N$).

In some examples, filter block 416 is configured to filter (e.g., remove, attenuate, etc.) at least a portion of the touch signal from Vin (e.g., $V_{sig}$). In some examples, filter block 416 is configured to pass through the noise signal from yin (e.g., $V_N$). In some examples, filter block 416 has a cutoff frequency (e.g., knee) between the frequency of the noise signal $V_N$ and the frequency of the touch signal $V_{sig}$. In some examples, the cutoff frequency of filter block 416 is variable and dynamically changes (e.g., is programmable based on a control signal received from the touch processor) based on the characteristics of the noise and/or touch signal, as will be described in more detail below. In some examples, filter block 416 is a high pass filter. In some examples, filter block 416 is a band pass filter. In some examples, the type of filter used can be selected based on the relationship between the noise and the signal. For example, if the frequency of the noise is below the frequency of the touch signal, then a low-pass filter can be selected (or a band-pass filter). If, on the other hand, the frequency of the noise is above the frequency of the touch signal, then a high-pass filter can be selected (or a band-pass filter). In some examples, the corner frequency of the high-pass filter can be configured to be above the touch frequency and below the noise frequency (e.g., halfway between the touch frequency and the noise frequency, closer to the noise frequency than the touch frequency, etc.). In some examples, setting the corner frequency of the filter between the touch frequency and the noise frequency configures the filter to pass through (or optionally partially attenuate) the noise signal such that the noise signal becomes common mode at both the noninverting and inverting inputs of amplifier 412. In this way, amplifier 412 automatically removes or reduces the noise signal, as will be discussed in more detail below. In some examples, setting the corner frequency of the filter between the touch frequency and the noise frequency configures the filter to filter out the touch signal and preventing the touch signal from becoming common mode.

Thus, the filtered signal provided to the non-inverting input port of amplifier 412 by filter block 416 includes the noise signal and includes none or an attenuated amount of the touch signal (e.g., filter block 416 isolates the noise component and eliminates or reduces the touch component based on the characteristics of filter block 416).

As shown in FIG. 4A, amplifier 412 receives Vin from one or more touch electrodes on the inverting input port and a filtered signal (based on $V_{in}$) on the noninverting input port. Thus, amplifier 412 amplifies the difference between yin which includes both the noise signal ($V_N$) and the touch signal ($V_{sig}$) and the filtered version of $V_{sig}$, which includes only the noise signal ($V_N$) (optionally also an attenuated touch signal, $V_{sig}$). In other words, the noise signal is common mode between the inverting input port and the noninverting input port. As a result, amplifier 412 eliminates (or reduces) the noise signal that is common between the inverting input port and the noninverting input port (or attenuates the noise signal, based on the characteristics of amplifier 412) and outputs an amplified/buffered signal that includes the touch signal (originating from the inverting input port) and does not include the noise signal (or includes an attenuated amount of the noise signal). In other words, amplifier 412 "cancels out" the noise signal that is common on both the inverting and noninverting input ports and preserves and/or amplifies the touch signal that is provided on the inverting input port but not on the noninverting input port (e.g., due to being filtered out by filter block 416).

FIG. 4B illustrates an exemplary touch sensor circuit 420 for filtering noise from a touch signal according to examples of the disclosure. In some embodiments, the touch sensor circuit 420 illustrates an embodiment of a frequency selective amplifier (e.g., an amplification circuit that is able to selectively amplify certain frequencies while not amplifying or filtering other frequencies). In some examples, touch sensor circuit 420 shares similar characteristics as touch sensor circuit 400 described above with respect to FIG. 4A. In some examples, touch sensor circuit 420 receives a touch sense signal from one or more touch electrodes, amplifies and/or buffers the touch signal, and transmits the touch signal for further processing, such as by touch processor 202. In some examples, touch sensor circuit 420 is integrated with sense channel 208 and can be coupled to a single sense signal or a plurality of sense signals. In some examples, touch sensor circuit 420 includes touch panel 421 and sensing circuit 430. In some examples, touch panel 421 is similar to touch panel 401 described above with respect to FIG. 4A, the details of which will not be repeated here.

In some examples, touch panel 421 generates a touch sense signal, Vin. In some examples, yin includes a touch signal ($V_{sig}$) and a noise signal ($V_N$). In some examples, sensing circuit 430 is coupled to and receives yin from touch panel 421. In some examples, sensing circuit 430 includes an amplifier 432, feedback capacitor 434, feedback resistor 436, high-pass filter capacitor 438, and high-pass filter resistor 440. In some examples, amplifier 432 is an operational amplifier and/or a differential amplifier including an inverting input port, a noninverting input port, and an output port, similar to amplifier 412 described above with respect to FIG. 4A. As shown in FIG. 4B, touch panel 421 is coupled to the inverting input port of amplifier 432. Thus, the inverting input port of amplifier 432 receives yin, which includes a touch signal component ($V_{sig}$) and a noise component ($V_N$).

As shown in FIG. 4B, feedback capacitor 434 and feedback resistor 436 are coupled in parallel, forming a feedback network coupled between the output port of amplifier 412 and the inverting input port of amplifier 412. In some examples, the values of feedback capacitor 434 and feedback resistor 436 control the amplification characteristics of amplifier 412 (e.g., gain, frequency response, etc.). In some examples, feedback capacitor 434 and feedback resistor 436 are fixed components. In some examples, feedback capacitor 434 and feedback resistor 436 are variable components that can be adjusted at manufacture time (e.g., calibrated static components) or adjusted during runtime (e.g., dynamic components). In some examples, the characteristics of the feedback network can affect whether the amplifier is operating as a charge amplifier (e.g., operating in charge amplifier mode) or as a transimpedance amplifier (e.g., operating in TIA mode). In some examples, while in charge amplifier mode, the impedance of the feedback network (e.g., the combination of feedback resistor 436, feedback capacitor 434, and any other feedback components) is dominated by the impedance of feedback capacitor 434 and while in TIA mode, the impedance of the feedback network is dominated by the impedance of the feedback resistor 436 at a given frequency. In some examples, the feedback characteristics of amplifier 412 affect the frequency response of amplifier 412. In some examples, amplifier 412 can have a gain curve such that amplifier 412 effectively acts as a high-pass filter (e.g., gain is higher for higher frequencies and lower for lower frequencies). In some examples, the high-pass cut-off frequency of amplifier 412 (e.g., whether in charge amplifier mode or TIA mode) can be defined by equation (1):

$$F_A = \frac{1}{2*\pi*C_{FB}*R_{FB}} \quad (1)$$

where $F_A$ is the cut-off frequency of amplifier 412, $C_{FB}$ is the capacitance of the feedback capacitor 434, and $R_{FB}$ is the resistance of the feedback resistor 436. Thus, in some examples, the filtering characteristics of the amplifier can be set based on the characteristics of the amplifier's feedback network. It is understood that input resistors or any other input components can affect the gain of the amplifier and can also affect the cut-off frequency of amplifier 412.

In some examples, high pass filter capacitor 438 is coupled to signal source 422 and the non-inverting input port of amplifier 432, and high pass filter resistor 440 is coupled to the non-inverting input port of amplifier 432 and a bias voltage ($V_{BIAS}$, or, optionally, system ground, earth ground, or any other reference voltage). In some examples, high pass filter capacitor 438 and high pass filter resistor 440 form a high pass filter (e.g., lower frequency signals are attenuated more than higher frequency signals). In some examples, the cut-off frequency of the high pass filter can be defined by equation (2):

$$F_{HP} = \frac{1}{2*\pi*C_{HP}*R_{HP}} \quad (2)$$

where $F_{HP}$ is the cut-off frequency of the high pass filter, CHP is the capacitance of the high pass filter capacitor 438, and $R_{FB}$ is the resistance of the high pass filter resistor 440.

In some examples, high pass filter capacitor 438 and high pass filter resistor 440 are selected such that the cutoff frequency of the filter is between the frequency of the noise signal $V_N$ and the frequency of the touch signal $V_{sig}$. Thus, filter capacitor 438 and filter resistor 440 is configured to filter (e.g., remove, attenuate, etc.) at least a portion of the touch signal $V_{sig}$ and pass through the noise signal $V_N$ to the non-inverting input port of amplifier 432 (e.g., in this example, the noise is in a higher frequency band than the touch signal). In some examples, filter capacitor 438 and filter resistor 440 are fixed components. In some examples, as described below, filter capacitor 438 and/or filter resistor 440 are variable and/or programmable. In some examples, a touch controller can provide a control signal to filter capacitor 438 and/or filter resistor 440 to change the corresponding values of filter capacitor 438 and/or filter resistor 440.

Returning to FIG. 4B, amplifier 432 receives the touch signal (e.g., touch component of $V_{in}$) and the noise signal (e.g., noise component of $V_{in}$) on the inverting input port and the noise signal on the noninverting input port. As a result, the noise signal is common on both the inverting input port and noninverting input port (e.g., common mode), and thus amplifier 432 can eliminate (or reduce) the noise signal that is common between the inverting input port and the noninverting input port (or attenuates the noise signal, based on the characteristics of amplifier 432) and outputs an amplified/buffered touch signal that includes the touch signal (originating from the inverting input port) and does not include the noise signal (or includes an attenuated amount of the noise signal). In other words, amplifier 432 "cancels out" the noise signal that is common on both the inverting and noninverting input ports and preserves and/or amplifies the touch signal that is provided on the inverting input port but not on the noninverting input port (e.g., due to being filtered out).

FIG. 4C illustrates an exemplary touch sensor circuit 450 for filtering noise from a touch signal according to examples of the disclosure. In some embodiments, the touch sensor circuit 450 illustrates an alternative embodiment of a frequency selective amplifier (e.g., an amplification circuit that is able to selectively amplify certain frequencies while not amplifying or filtering other frequencies). In some examples, touch sensor circuit 450 is similar to sensor circuit 420 described above with respect to FIG. 4B, but includes multiplexer 472 for switching between a filtered mode and an unfiltered mode and series resistor 474.

In some examples, series resistor 474 is a resistor coupled to the inverting input of amplifier 462 (e.g., an input resistor). In some examples, series resistor 474 is a fixed component. In some examples, series resistor 474 is a variable component (e.g, programmable) that is adjustable to adjust the frequency response of amplifier 462. In some examples, series resistor 474 is optional and not included in touch sensor circuit 450.

As shown in FIG. 4C, the output port of multiplexer 472 is coupled to the noninverting input port of amplifier 462. Thus, multiplexer 472 controls what signal is coupled to/provided to the non-inverting input port of amplifier 462. In some examples, one input port of multiplexer 472 (e.g., the "0" port) is coupled to the output of the filter formed by filter resistor 468 and filter resistor 470 (e.g., or any other filter element configured to filter at least a portion of the touch signal $V_{sig}$ and pass through the noise signal $V_N$, such as in filter block 416). In some examples, another input port of multiplexer 472 (e.g., the "1" port) is coupled to a bias voltage ($V_{BIAS}$, or, optionally, a reference signal such as system ground, earth ground, virtual ground, etc.). In some examples, multiplexer 472 can have other input ports coupled to other sources. Thus, multiplexer 472 is able to select between the filtered version of $V_{in}$ or $V_{BIAS}$. In some examples, this allows touch sensor circuit 450 to select between automatically removing the noise signal when amplifying the touch signal using sensing circuit 460 (e.g., filter mode, in which the noise is filtered) or amplifying the touch signal without automatically removing the noise signal (e.g., unfiltered mode, in which the noise is not filtered). In some examples, when the multiplexer control is set to 0 (e.g., multiplexer 472 selects the $0^{th}$ input port), the filter network (e.g., comprising the combination of filter capacitor 468 and filter resistor 470) is selected and amplifier 462 is operating in a bandpass filter mode, and when the multiplexer control is set to "1" (e.g., multiplexer 472 selects the $1^{st}$ input port), the filter network is bypassed and amplifier 462 is operating in a transimpedance amplifier mode or charge amplifier mode (e.g., as described above with respect to FIG. 4B).

In some examples, the touch processor provides a control signal to multiplexer 472 to select between the filter and system ground. In some examples, the touch processor can enable the filter (e.g., select the filter) if the device enters into a known high-noise mode. For example, if NFC circuitry (near field communication) is enabled and generating noise, the touch processor can enable the filter to mitigate the NFC generated noise. In other examples, if the display enters into a high noise mode, the touch processor can enable the filter to mitigate the display noise. In some examples, when not in a high noise mode (e.g., such as in a low power mode or when the display is turned off), the system can disable the filter (e.g., select system ground) to reduce complexity and/or reduce power consumption.

It is understood that the selection functionality of multiplexer 472 can be achieved with any type of suitable switching circuitry and is not limited to multiplexers. For example, transistors, relays, and/or switches can be used to achieve a similar switching functionality.

In some examples, when the feedback network (e.g., feedback resistor 464 and/or feedback resistor 466) is configured in TIA mode (e.g., where the impedance of feedback capacitor 464 is less than the impedance of feedback resistor 466) and multiplexer 472 is configured to enable the use of the filter (e.g., the filter generated by filter resistor 468 and filter resistor 470), the transfer function of touch sensor circuit 450 can be described by equation (3) and/or (4):

$$V_{OUT} = -V_{NZ} * \frac{s * C_{NZ} * R_{FB} * \left(1 - \frac{s}{Z_0}\right)}{\frac{s^2}{\omega_0^2} + \frac{s}{Q * \omega_0} + 1} \quad (3)$$

$$V_{OUT} = -V_{STM} * \frac{s * C_{SIG} * R_{FB} * \left(1 - \frac{s}{Z_0}\right)}{\frac{s^2}{\omega_0^2} + \frac{s}{Q * \omega_0} + 1} \quad (4)$$

where $\omega_0$, $z_0$, and Q are defined by the following equations:

$$\omega_0 = \frac{1}{\sqrt{(C_{NZ} + C_{SIG}) * R_{HP} * R_S * C_{HP}}} \quad (5)$$

$$z_0 = \frac{R_{FB}}{C_{HP} * R_{HP} * R_S} \quad (6)$$

$$Q \approx \sqrt{\frac{C_{HP} * R_{HP} * (C_{SIG} + C_{NZ})}{(C_{HP} + C_{SIG} + C_{NZ})^2 * R_S}} \quad (7)$$

where $R_S$ is the input resistance of amplifier 362.

It is understood that any of the filter components and/or amplifier feedback components described above can be fixed or variable such that the characteristics of the filter and/or characteristics of the amplifier feedback (and thus the characteristics of the amplifier) are variable. In some examples, the filter and/or amplifier components are calibrated at manufacture time. In some examples, the filter and/or amplifier components can be dynamically adjusted during runtime based on the characteristics of the noise and/or touch activity. For example, if the frequency of the noise decreases during runtime due to changes in the environment, then the cut-off frequency of the filter can be decreased to improve noise isolation (and vice versa). In some examples, if the frequency of the touch signal changes due to a change in the drive signal, then the cut-off frequency of the filter can be adjusted appropriately. In some examples, if the frequency of the noise increases during runtime, then the cut-off frequency of the filter can be maintained at the same frequency due to resulting in a better isolation of the noise frequency. In some examples, the system can perform a spectral analysis to determine the optimal parameters of the filter. In some examples, the cutoff frequency can be selected to optimize the signal-to-noise ratio (SNR) of the signal. In some examples, optimizing the signal-to-noise ratio can involve balancing attenuating as much of the touch signal while passing through as much of the noise signal.

It is also understood that the feedback and filter networks described above can have more or fewer components than those illustrated. For example, a suitable feedback network may include a resistor without a capacitor. In some examples, a suitable filter can include an inductor. In some examples, the touch sensing circuits described above can include more or fewer components than those illustrated. For example, the touch sensing circuits can include input resistors, input capacitors, output capacitors, etc.

Figure 5A:
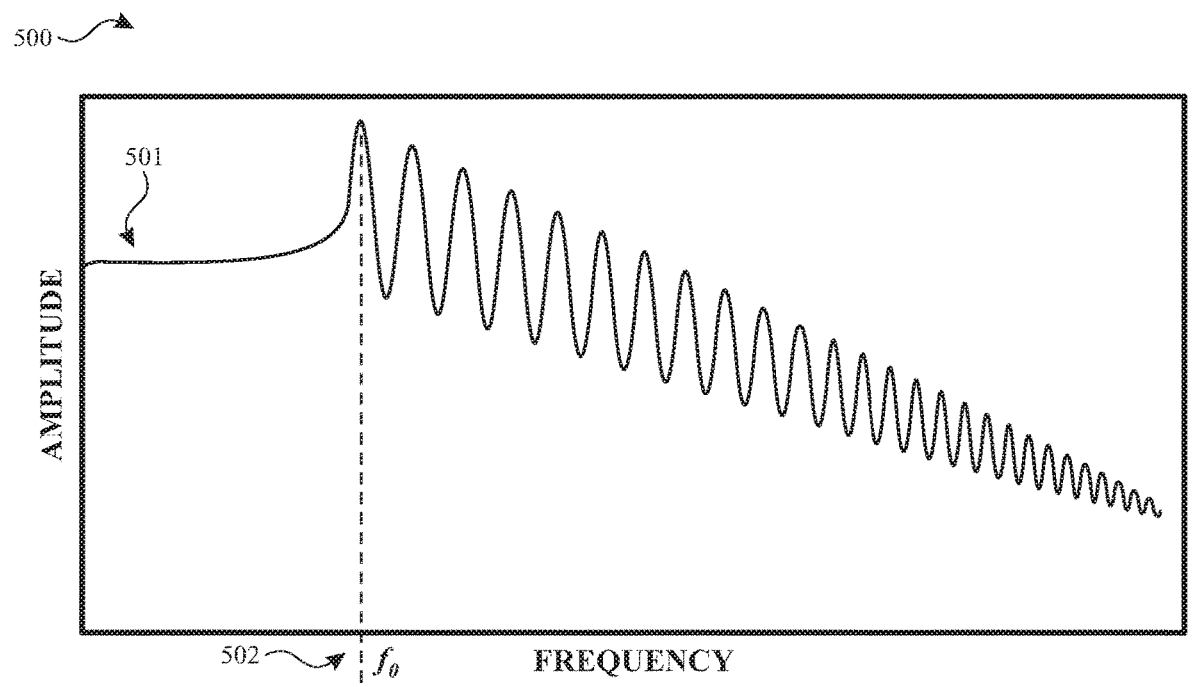
FIGS. 5A-5B illustrate frequency domain signal graphs of exemplary touch sensor circuits according to examples of the disclosure.
Figure 5B:
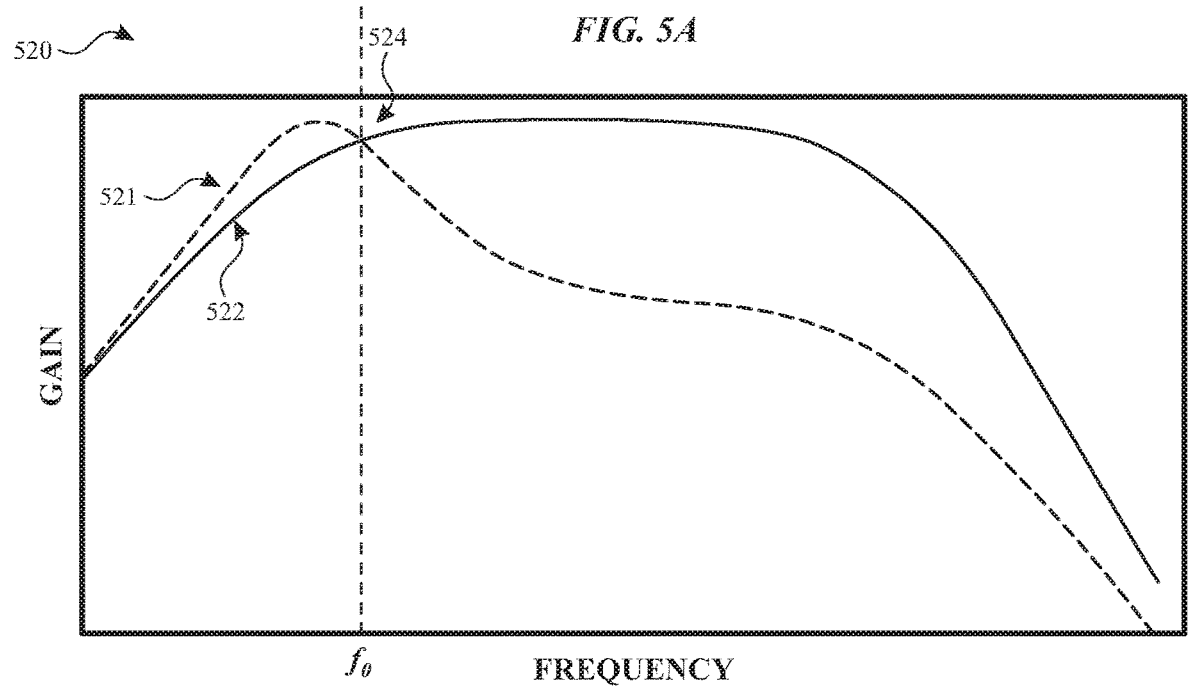

FIGS. 5A-5B illustrate frequency domain signal graphs of exemplary touch sensor circuits according to examples of the disclosure. FIG. 5A illustrates an exemplary graph 500 of the display noise experienced by an integrated display device (e.g., such as in stackup 300). As shown in FIG. 5A, signal 501 is plotted in the frequency domain (e.g., frequency against gain or signal power). In FIG. 5A, signal 501 includes a peak at frequency 502 corresponding to the first harmonic of the display noise (e.g., fundamental frequency $f_0$). In some examples, frequency 502 is half of the frequency that the display data line is operating at (e.g., the refresh rate, the clock frequency, the switching frequency, etc.). As shown in FIG. 5A, signal 501 includes a plurality of peaks at frequencies above frequency 502 corresponding to higher harmonics of the display noise. In some examples, the signal power at higher harmonics are less than the signal power at the lower harmonics, as shown.

FIG. 5B illustrates an exemplary graph 520 of the frequency response of noise mitigation systems described herein (e.g., touch sensor circuits 400, 420, and 450). In FIG. 5B, signal 521 represents the frequency response of the touch sensor circuit with the filtering enabled (e.g., multiplexer 472 set to "0") and signal 522 represents the frequency response of the touch sensor circuit with the filtering disabled (e.g., multiplexer 472 set to "1"). As shown in FIG. 5B, signal 521 (e.g., a touch-sensor circuit with a high pass filter enabled) has a maximum noise rejection at a peak frequency and decreasing noise rejection at frequencies above the peak frequency. It is understood that the frequency response graph shown in FIG. 5B is merely exemplary and the filtering circuit can be configured with more or fewer poles and/or zeros to achieve the desired frequency response. In some examples, signal 521 (e.g., a touch-sensor circuit with a high pass filter disabled) resembles a band-pass filter. It is understood that the frequency response of the touch sensor circuit without filtering enabled is merely exemplary and can be have any type of response based on the type of touch sensor circuit used (e.g., type of amplifier, value of the components, etc.).

As shown in FIG. 5B, the cut-off frequency of the high pass filter can be set such that signal 521 intersects with signal 522 at intersection 524 (e.g., the first harmonic frequency of the display noise $f_0$). In this manner, the touch sensor circuit (e.g., touch sensor circuit 450) is configured such that the noise rejection for the first harmonic of the display noise is the same in both the filtered and unfiltered modes. In some examples, because the system knows the frequency at which the display is driven, the system is able to predict the first harmonic of the display noise and set the cut-off frequency appropriately. As discussed above, setting the cut-off frequency of the high pass filter includes calculating the cut-off frequency based on the characteristics of the feedback components (e.g., equations (1) and (2) described above).

As shown in FIG. 5B, a touch sensing circuit having a frequency response of 521 is better able to reject noise at frequencies above the first harmonic frequency than a touch sensing circuit with the frequency response of 522. Thus, as discussed above, the touch sensor circuit can be configured such that when better noise rejection is required for higher frequency noise, the touch sensor circuit can enable the filter and when better noise rejection is not required for higher frequency noise, the touch sensor can disable the filter. For example, the display can be disabled in certain modes (e.g., low power mode, display off mode), and in these situations, the system can disable filtering because display noise is not expected.

Figure 6:
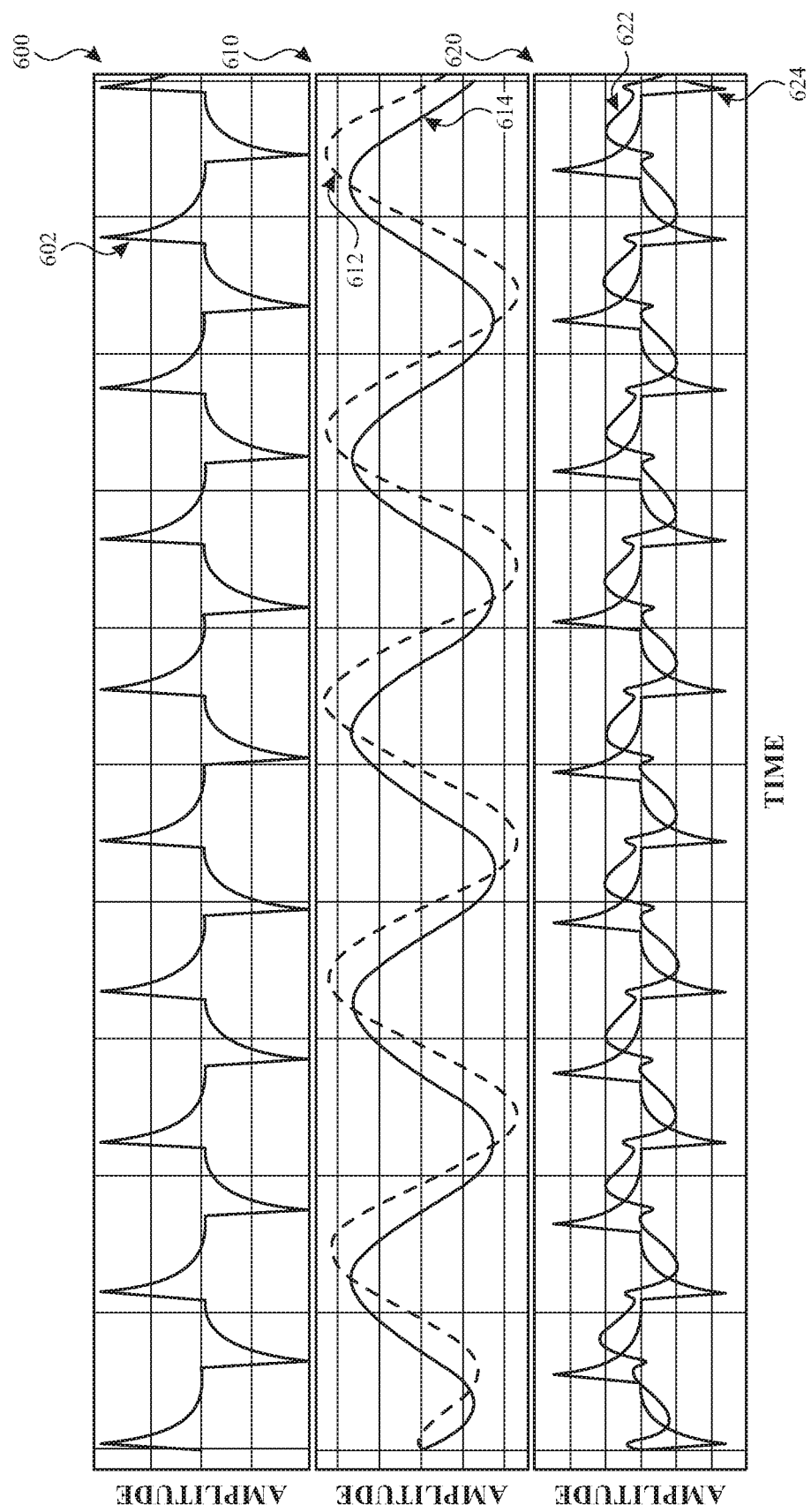
FIG. 6 illustrates time domain signal graphs of exemplary touch sensor circuits according to examples of the disclosure.

FIG. 6 illustrates time domain signal graphs of exemplary touch sensor circuits according to examples of the disclosure. Graph 600 includes signal 602 corresponding to an exemplary profile of a display noise signal. As shown in FIG. 6, signal 602 can include periodic positive and negative signal spikes (e.g., at the switching frequency of the display TFTs, for example). In some examples, graph 610 illustrates the signal output of the exemplary touch sensor circuits described above e.g., touch sensor circuits 400, 420, 450). In FIG. 6, graph 610 includes signal 612 and 614. In some examples, signal 612 corresponds to an exemplary output signal (e.g., $V_{out}$) of an exemplary touch sensor circuit while in filter mode (e.g., when the filter network is enabled). In some examples, signal 614 corresponds to an exemplary output signal (e.g., $V_{out}$) of an exemplary touch sensor circuit (e.g., such as touch sensor circuit 450) when not in filter mode (e.g., when the filter network is bypassed). As shown in FIG. 6, because the gain of the touch sensor circuit when in filter mode is higher at low frequencies than the touch sensor circuit when not in filter mode, the amplitude of signal 612 is larger than the amplitude of signal 614. In some examples, because of the additional filter mechanism, signal 612 has a different phase offset than signal 614 (e.g., the phase response of the touch sensor circuit 450 is different when in filter mode vs. when the filter is bypassed). In FIG. 6, graph 620 includes signal 622 and signal 624. In some examples, signal 624 is an exemplary noise component of the output signal (e.g., $V_{out}$) of an exemplary touch sensor circuit (e.g., such as touch sensor circuit 450) when the filter network is bypassed (e.g., when the filter is disabled). In some examples, as shown in FIG. 6, the profile of signal 624 is similar to the profile of signal 624 (e.g, the display noise signal). In some embodiments, signal 624 is an attenuated version of signal 602. In some examples, signal 622 is an exemplary noise component of the output signal (e.g., $V_{out}$) of an exemplary touch sensor circuit (e.g., such as touch sensor circuit 450) when in filter mode (e.g., when the filter network is enabled). As shown in FIG. 6, signal 622 is more attenuated than signal 624 and has a different signal profile than signal 624. Thus, as shown, enabling the filter network allows the touch sensor circuit to filter and/or attenuate certain frequencies of the noise signal, causing the resulting noise output to have a smaller amplitude and a different profile (e.g., fewer and/or smaller high frequency peaks). Thus, in some examples, the effective signal-to-noise ratio of the touch sensing circuit with the filter enabled (e.g., multiplexer selecting the filter network) is higher (e.g., better) than the effective signal-to-noise ratio of the touch sensing circuit with the filter disabled (e.g., multiplexer selecting $V_{BIAS}$). In some examples, a higher signal-to-noise ratio at the touch sensing circuit can reduce the SNR budget requirements for downstream circuitry, which can allow for power and size savings (and corresponding cost savings).

Therefore, according to the above, some examples of the disclosure are directed to a touch controller. In some examples, the touch controller comprises sense circuitry configured to sense touch activity from one or more touch electrodes on a touch sensor panel. Additionally or alternatively, in some examples, the sense circuitry includes a differential amplifier including a first input port coupled to a sense line and a second input port. Additionally or alternatively, in some examples, the sense circuitry includes a filter circuit coupled to the sense line, wherein the filter is configured to filter a touch signal from the sense line and output a filtered signal to the second input port of the differential amplifier.

Additionally or alternatively, in some examples, the filtered signal includes a noise signal. Additionally or alternatively, in some examples, the differential amplifier is configured to output, via an output port, an amplified difference between a signal on the first input port and a signal on the second input port. Additionally or alternatively, in some examples, the filter circuit includes a high pass filter. Additionally or alternatively, in some examples, the touch controller includes a multiplexer configured to, in a first mode, couple the second input port of the differential amplifier to an output of the filter circuit and, in a second mode, couple the second input port of the different amplifier to a reference signal.

Additionally or alternatively, in some examples, the filter includes a variable resistor or a variable capacitor. Additionally or alternatively, in some examples, the touch controller includes a programmable input resistor coupled to the first input port. Additionally or alternatively, in some examples, the touch controller includes a feedback network coupled between the first input port and an output port of the differential amplifier, wherein the feedback network includes at least one of a programmable capacitor or a programmable resistor. Additionally or alternatively, in some examples, the sense circuitry is configured based on a spectral distribution of noise.

Some examples of the disclosure are directed to a method. In some examples, the method comprises receiving, via a sense line, a touch signal associated with touch activity from one or more touch electrodes on a touch sensor panel. Additionally or alternatively, in some examples, the method comprises generating, via a filter, a filtered signal by filtering the touch signal from the sense line. Additionally or alternatively, in some examples, the method comprises amplifying, via a differential amplifier, a difference between the touch signal and the filtered signal.

Additionally or alternatively, in some examples, the filtered signal includes a noise signal. Additionally or alternatively, in some examples, the filter includes a high pass filter. Additionally or alternatively, in some examples, the method includes, while in a first mode, coupling, via a multiplexer, the differential amplifier to an output of the filter. Additionally or alternatively, in some examples, the method includes, while in a second mode, coupling, via the multiplexer, the differential amplifier to a reference signal. Additionally or alternatively, in some examples, the filter includes a variable resistor or a variable capacitor.

Additionally or alternatively, in some examples, a feedback network is coupled between a first input port and an output port of the differential amplifier, the feedback network including at least one of a programmable capacitor or a programmable resistor. Additionally or alternatively, in some examples, the method includes configuring one or more of the filter and the differential amplifier based on a spectral distribution of noise.

Some examples of the disclosure are directed to an electronic device. In some examples, the electronic device includes a display, a touch sensor panel (e.g., separate from or integrated with the display, such as a touch screen), and a touch controller coupled to the touch sensor panel. In some examples, the touch controller includes sense circuitry configured to sense touch activity from one or more touch electrodes on the touch sensor panel. Additionally or alternatively, in some examples, the sense circuitry includes a differential amplifier including a first input port coupled to a sense line and a second input port. Additionally or alternatively, in some examples, the sense circuitry includes a filter circuit coupled to the sense line, wherein the filter is configured to filter a touch signal from the sense line and output a filtered signal to the second input port of the differential amplifier.

Additionally or alternatively, in some examples, the filtered signal includes a noise signal. Additionally or alternatively, in some examples, the filter circuit includes a high pass filter. Additionally or alternatively, in some examples, the touch controller further includes a multiplexer configured to, in a first mode, couple the second input port of the differential amplifier to an output of the filter circuit and, in a second mode, couple the second input port of the different amplifier to a reference signal.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. A touch controller, comprising:
sense circuitry configured to sense touch activity from one or more touch electrodes on a touch sensor panel, including:
 a differential amplifier including a first input port coupled to a sense line and a second input port; and
 a filter circuit coupled to the sense line, wherein the filter circuit is configured to filter a touch signal from the sense line and output a filtered signal to the second input port of the differential amplifier.

2. The touch controller of claim 1, wherein the filtered signal includes a noise signal.

3. The touch controller of claim 1, wherein the differential amplifier is configured to output, via an output port, an amplified difference between a signal on the first input port and a signal on the second input port.

4. The touch controller of claim 1, wherein the filter circuit includes a high pass filter.

5. The touch controller of claim 1, further comprising:
a multiplexer configured to, in a first mode, couple the second input port of the differential amplifier to an output of the filter circuit and, in a second mode, couple the second input port of the different amplifier to a reference signal.

6. The touch controller of claim 1, wherein the filter circuit includes a variable resistor or a variable capacitor.

7. The touch controller of claim 1, further comprising a programmable input resistor coupled to the first input port.

8. The touch controller of claim 1, further comprising a feedback network coupled between the first input port and an output port of the differential amplifier, wherein the feedback network includes at least one of a programmable capacitor or a programmable resistor.

9. The touch controller of claim 1, wherein the sense circuitry is configured based on a spectral distribution of noise.

10. A method, comprising:
receiving, via a sense line, a touch signal associated with touch activity from one or more touch electrodes on a touch sensor panel;
generating, via a filter, a filtered signal by filtering the touch signal from the sense line; and
amplifying, via a differential amplifier, a difference between the touch signal and the filtered signal.

11. The method of claim 10, wherein the filtered signal includes a noise signal.

12. The method of claim 10, wherein the filter includes a high pass filter.

13. The method of claim 10, further comprising:
while in a first mode, coupling, via a multiplexer, the differential amplifier to an output of the filter; and
while in a second mode, coupling, via the multiplexer, the differential amplifier to a reference signal.

14. The method of claim 10, wherein the filter includes a variable resistor or a variable capacitor.

15. The method of claim 10, wherein a feedback network is coupled between a first input port and an output port of the differential amplifier, the feedback network including at least one of a programmable capacitor or a programmable resistor.

16. The method of claim 10, further comprising configuring one or more of the filter and the differential amplifier based on a spectral distribution of noise.

17. An electronic device comprising:
a display;
a touch sensor panel; and
a touch controller coupled to the touch sensor panel, wherein the touch controller includes:

sense circuitry configured to sense touch activity from one or more touch electrodes on the touch sensor panel, including:
a differential amplifier including a first input port coupled to a sense line and a second input port; and
a filter circuit coupled to the sense line, wherein the filter circuit is configured to filter a touch signal from the sense line and output a filtered signal to the second input port of the differential amplifier.

18. The electronic device of claim 17, wherein the filtered signal includes a noise signal.

19. The electronic device of claim 17, wherein the filter circuit includes a high pass filter.

20. The electronic device of claim 17, wherein the touch controller further includes:
a multiplexer configured to, in a first mode, couple the second input port of the differential amplifier to an output of the filter circuit and, in a second mode, couple the second input port of the different amplifier to a reference signal.

* * * * *